United States Patent
Yu et al.

(10) Patent No.: US 10,540,455 B2
(45) Date of Patent: Jan. 21, 2020

(54) METHOD AND SYSTEM FOR PLACING ROOMS IN A DEPARTMENT

(71) Applicant: Aditazz, Inc., Brisbane, CA (US)

(72) Inventors: Robert Yu, Fremont, CA (US); Scott Ewart, Berkeley, CA (US); John Victor-Faichney, San Francisco, CA (US); Sudha Hajela, Brisbane, CA (US); Sophia Lin, Brisbane, CA (US)

(73) Assignee: ADITAZZ, INC., Brisbane, CA (US)

( * ) Notice: Subject to any disclaimer, the term of this patent is extended or adjusted under 35 U.S.C. 154(b) by 599 days.

(21) Appl. No.: 15/193,651

(22) Filed: Jun. 27, 2016

(65) Prior Publication Data

US 2017/0004229 A1 Jan. 5, 2017

Related U.S. Application Data

(60) Provisional application No. 62/185,548, filed on Jun. 26, 2015.

(51) Int. Cl.
 *G06F 17/50* (2006.01)
(52) U.S. Cl.
 CPC ............... *G06F 17/5004* (2013.01)
(58) Field of Classification Search
 CPC ............ G06F 17/5004; G06F 2217/02
 See application file for complete search history.

(56) References Cited

U.S. PATENT DOCUMENTS

| 8,989,440 B2* | 3/2015 | Klusza ............... G06F 17/5004 382/286 |
| 2007/0113518 A1 | 5/2007 | Walker |
| 2008/0208719 A1* | 8/2008 | Sharma ............ G06Q 10/0875 705/29 |
| 2010/0198563 A1 | 8/2010 | Plewe |
| 2013/0222239 A1 | 8/2013 | Galor |
| 2014/0025347 A1* | 1/2014 | Kim .................... G06F 17/5004 703/1 |
| 2014/0052416 A1 | 2/2014 | Yu et al. |
| 2014/0237035 A1* | 8/2014 | Smith .................... G06F 17/50 709/203 |
| 2014/0288890 A1 | 9/2014 | Khainson et al. |
| 2018/0120793 A1* | 5/2018 | Tiwari .................. G06Q 10/06 |

FOREIGN PATENT DOCUMENTS

WO 2014145592 A1 9/2014

OTHER PUBLICATIONS

International Search Report, PCT/US2016/039552, dated Sep. 16, 2016.

* cited by examiner

*Primary Examiner* — Jay Hann

(57) ABSTRACT

A computer-implemented method for generating multiple room placements is disclosed. In the embodiment, the method involves obtaining information indicating a number of rooms to be placed in a department, the information including room type information, capturing at least one room pattern using a pattern language-based regular expression, and generating a plurality of room placements using the at least one room pattern by placing the rooms to be placed in the department according to the selected room pattern.

24 Claims, 10 Drawing Sheets

202

| g | Name | Symbol | Width | Length | Height | Min | Typ | Max |
|---|---|---|---|---|---|---|---|---|
| 10 | room_checkin | a | 20 | 10 | 8 | 1 | 1 | 1 |
| 11 | room_checkout | b | 10 | 10 | 8 | 2 | 2 | 2 |
| 12 | room_clean_util | c | 10 | 15 | 8 | 1 | 1 | 1 |
| 13 | room_consult | d | 10 | 10 | 8 | 1 | 1 | 1 |
| 14 | room_copy_print_fa | e | 20 | 10 | 8 | 1 | 1 | 1 |
| 15 | room_draw_inject | f | 10 | 10 | 8 | 1 | 1 | 1 |
| 16 | room_equip_alcove | g | 10 | 10 | 8 | 1 | 1 | 1 |
| 17 | room_exam_m | h | 10 | 10 | 8 | 10 | 14 | 14 |
| 18 | room_exam_l | i | 10 | 15 | 8 | 4 | 4 | 4 |
| 19 | room_ma_station | j | 15 | 15 | 8 | 2 | 2 | 2 |
| 20 | room_manager | k | 10 | 10 | 8 | 1 | 1 | 1 |
| 21 | room_medication | l | 10 | 15 | 8 | 1 | 1 | 1 |
| 22 | room_msg_ctr | m | 5 | 10 | 8 | 1 | 1 | 1 |
| 23 | room_office | n | 10 | 10 | 8 | 7 | 8 | 8 |
| 24 | room_pat_toilet | o | 10 | 10 | 8 | 2 | 2 | 2 |
| 25 | room_proc_lab | p | 10 | 10 | 8 | 1 | 1 | 1 |
| 26 | room_procedure | q | 15 | 15 | 8 | 2 | 2 | 2 |
| 27 | room_referral | r | 10 | 10 | 8 | 2 | 2 | 2 |
| 28 | room_scale | s | 5 | 10 | 8 | 2 | 2 | 2 |
| 29 | room_storage | t | 5 | 10 | 8 | 1 | 1 | 1 |

| | Name | Symbol | Width | Length | Height | Min | Typ | Max |
|---|---|---|---|---|---|---|---|---|
| 9 | | | | | | | | |
| 10 | room_checkin | a | 20 | 10 | 8 | 1 | 1 | 1 |
| 11 | room_checkout | b | 10 | 10 | 8 | 2 | 2 | 2 |
| 12 | room_clean_util | c | 10 | 15 | 8 | 1 | 1 | 1 |
| 13 | room_consult | d | 10 | 10 | 8 | 1 | 1 | 1 |
| 14 | room_copy_print_fa | e | 20 | 10 | 8 | 1 | 1 | 1 |
| 15 | room_draw_inject | f | 10 | 10 | 8 | 1 | 1 | 1 |
| 16 | room_equip_alcove | g | 10 | 10 | 8 | 1 | 1 | 1 |
| 17 | room_exam_m | h | 10 | 10 | 8 | 10 | 14 | 14 |
| 18 | room_exam_l | i | 10 | 15 | 8 | 4 | 4 | 4 |
| 19 | room_ma_station | j | 15 | 15 | 8 | 2 | 2 | 2 |
| 20 | room_manager | k | 10 | 10 | 8 | 1 | 1 | 1 |
| 21 | room_medication | l | 10 | 15 | 8 | 1 | 1 | 1 |
| 22 | room_msg_ctr | m | 5 | 10 | 8 | 1 | 1 | 1 |
| 23 | room_office | n | 10 | 10 | 8 | 7 | 8 | 8 |
| 24 | room_pat_toilet | o | 10 | 10 | 8 | 2 | 2 | 2 |
| 25 | room_proc_lab | p | 10 | 10 | 8 | 1 | 1 | 1 |
| 26 | room_procedure | q | 15 | 15 | 8 | 2 | 2 | 2 |
| 27 | room_referral | r | 10 | 10 | 8 | 2 | 2 | 2 |
| 28 | room_scale | s | 5 | 10 | 8 | 2 | 2 | 2 |
| 29 | room_storage | t | 5 | 10 | 8 | 1 | 1 | 1 |

FIG. 2

| Symbol | Meaning | Examples |
|---|---|---|
| a-z | Each symbol represents a room type | a, b, c, |
| () | Grouping | (abc)<br>• abc<br>(ab)(cd)<br>• abcd<br>((ab)(cd)(ef))<br>• abcdef |
| [] | Character classes | [abc]<br>• a<br>• b<br>• c<br>[ab][cd]<br>• ac<br>• bc<br>• ad<br>• bd |
| . | Any room | (a.c)<br>• abc<br>• adc<br>• aec |
| ? | "Zero or one"<br><br>The previous character, character class, meta-character class or group occurs between 0 or 1 time | a?<br>• Empty<br>• a<br>(abc)?<br>• Empty<br>• abc<br>((ab)?(cd))<br>• abcd<br>• ad |
| * | "Zero or more"<br><br>The previous character, character class, meta-character class or group occurs between 0 to unlimited times (inclusive). | a*<br>• Empty<br>• A<br>• Aa<br>• aaaaaa<br>(ab)*<br>• Empty<br>• Ab<br>• Abab<br>• Ababab |

FIG. 5A

| | | |
|---|---|---|
| + | "One or more"<br><br>The previous character, character class, meta-character class or group occurs between 1 to unlimited times (inclusive) | a+<br>• a<br>• aa<br>• aaaa<br>((ab)+(cd)e+)<br>• abcde<br>• ababcde<br>• ababcdeeeeeee |
| {2} | The previous character, character class, meta-character class or group occurs 2 times. | a{2}<br>• aa<br>(ab){2}<br>• abab |
| {1,3} | The previous character, character class, meta-character class or group occurs between 1 to 3 times (inclusive). | a{1,3}<br>• a<br>• aa<br>• aaaa<br>(ab)+{1,3}<br>• ab<br>• abab<br>• ababab |
| {4,} | The previous character, character class, meta-character class or group occurs between 4 and unlimited times (inclusive) | a{4,}<br>• aaaa<br>• aaaaa<br>• aaaaaa<br>(ab){3,}<br>• ababab<br>• abababab |
| \| | Alternatives | ab\|cd<br>• ab<br>• cd<br>Fla(t\|ipper)<br>• flat<br>• flipper |
| \n | Backreference | (a(b)c)\1\2<br>• abcabcb<br>(ab)(cd)\2\1<br>• abcdcdab |
| [^] | Negated class | [^abcde]<br>• f<br>• g<br>• h<br>• i |

FIG. 5B

METHOD AND SYSTEM FOR PLACING ROOMS IN A DEPARTMENT

BACKGROUND

Buildings are an integral part of everyday life. The process of planning, designing, and constructing buildings has evolved over several thousands of years. Today, the steps followed to physically realize modern buildings are very complicated and require a high degree of skilled labor that can span several different disciplines. This complexity poses a huge challenge in terms of time, money, and other resources expended in order to build a viable facility that can be used to deliver the intended services in an efficient and profitable way.

SUMMARY

In a first embodiment, a computer-implemented method for generating multiple room placements is disclosed. In the embodiment, the method involves obtaining information indicating a number of rooms to be placed in a department, the information including room type information, capturing at least one room pattern using a pattern language-based regular expression, and generating a plurality of room placements using the at least one room pattern by placing the rooms to be placed in the department according to the selected room pattern.

In another embodiment, a computer-implemented method for placing rooms in a department is disclosed. In an embodiment, the method involves obtaining a space plan that identifies the types and numbers of rooms to be placed, obtaining information about the room types identified in the space plan, obtaining a department block that includes at least one well, the at least one well having a corresponding room pattern that is defined by a regular expression using a pattern language, using the space plan, the information about the room types, and the room pattern to generate at least one room placement that defines the placement of all of the rooms from the space plan into the department block according to the room pattern, and outputting a graphical depiction of the at least one room placement.

BRIEF DESCRIPTION OF THE DRAWINGS

FIG. 2 is an example of a portion of a space program.

FIGS. 5A-5B are a glossary of symbols used by an exemplary pattern language.

DETAILED DESCRIPTION

Figure 1:
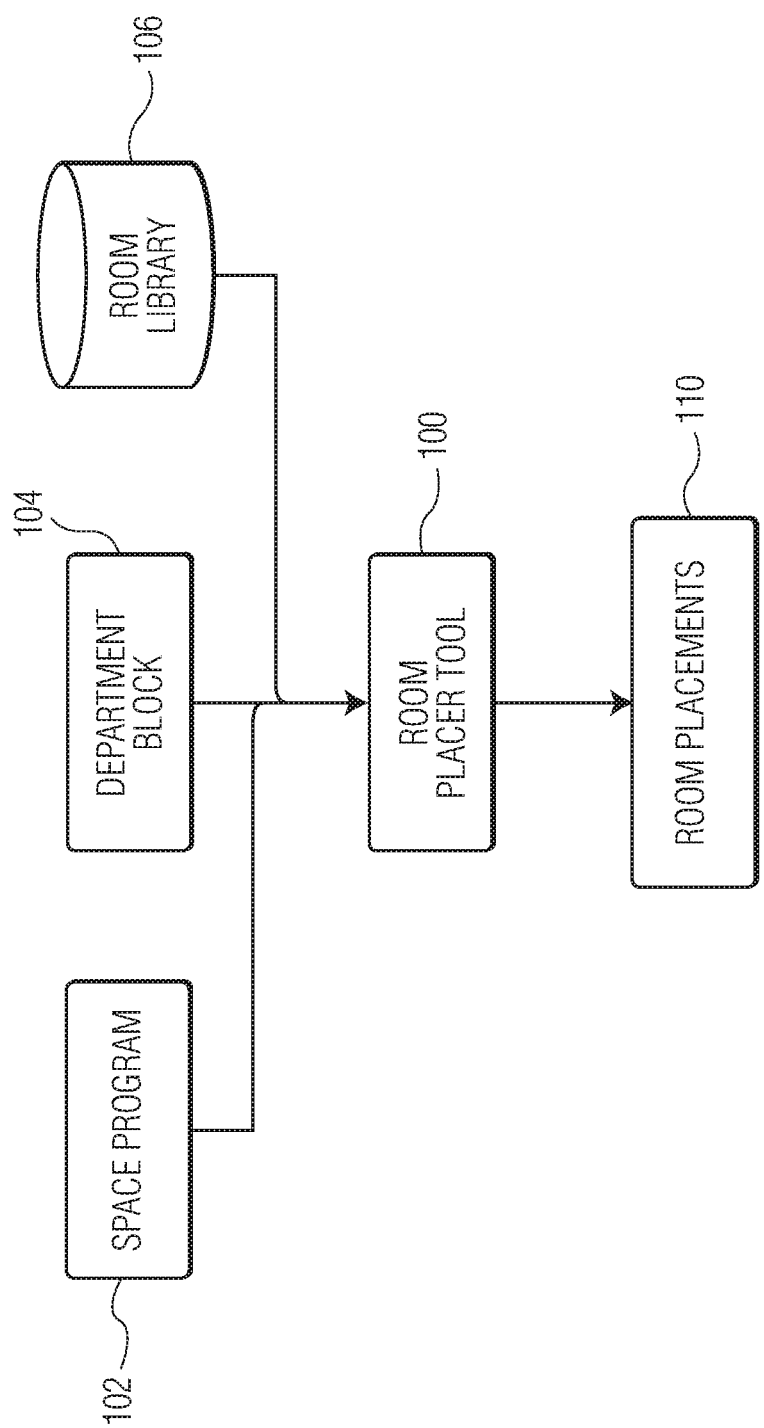
FIG. 1 depicts an embodiment of a room placement tool and illustrates an example operation.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

A method and system for placing rooms in a department of a building or buildings is disclosed. In an embodiment, the method and system is applicable to a complex building in which healthcare services are provided such as a hospital or medical office. In an embodiment, the technique includes a computer-implemented room placement tool that automates the placement of rooms in a given department block, such as a surgery department block or a patient recovery department block.

In a first embodiment, a computer-implemented method for generating multiple room placements is disclosed. In the embodiment, the method involves obtaining information indicating a number of rooms to be placed in a department, the information including room type information, capturing at least one room pattern using a pattern language-based regular expression, and generating a plurality of room placements using the at least one room pattern by placing the rooms to be placed in the department within a room placement according to the selected room pattern.

In another embodiment, a computer-implemented method for placing rooms in a department is disclosed. The method involves obtaining a space plan that identifies the types and numbers of rooms to be placed; obtaining information about the room types identified in the space plan; obtaining a department block that includes at least one well, the at least one well having a corresponding room pattern that is defined by a regular expression using a pattern language; using the space plan, the information about the room types, and the room pattern, generating at least one room placement that defines the placement of all of the rooms from the space plan into the department block according to the room pattern; and outputting a graphical depiction of the at least one room placement.

FIG. 1 depicts an embodiment of a room placement tool 100 and illustrates an example operation. FIG. 1 includes a room placement tool 100 that receives a space program 102, a department block 104, and a room library 106 as inputs and outputs room placements indicating a placement of rooms in a department. Elements of FIG. 1 are described below.

Space Program

FIG. 2 is an example of a portion of a space program 202. In an embodiment, a space program defines the type and number of rooms that need to be placed in a department. In an embodiment, entries in a space program are a list of room types and an associated formal description for each room type. In an embodiment, the formal description for each room type associates the following information with each room type: a room type name, a room symbol (which is used in the pattern language), a room width, a room length, a room height, a minimum number of rooms of that type, a typical number of rooms of that type, and a maximum number of rooms of that type. For example, a type of room used for patient check-in is identified in a space program by the name "room_checkin," is represented by the symbol "a" in the pattern language, and has a width of 20 ft, a length of 10 ft, and a height of 8 ft. The space program also indicates that this type of room occurs at least once (min), typically once (typ), and a maximum of once (max) in a room placement. In an embodiment, the space program is provided as an .xml file.

Department Block

Figure 3:
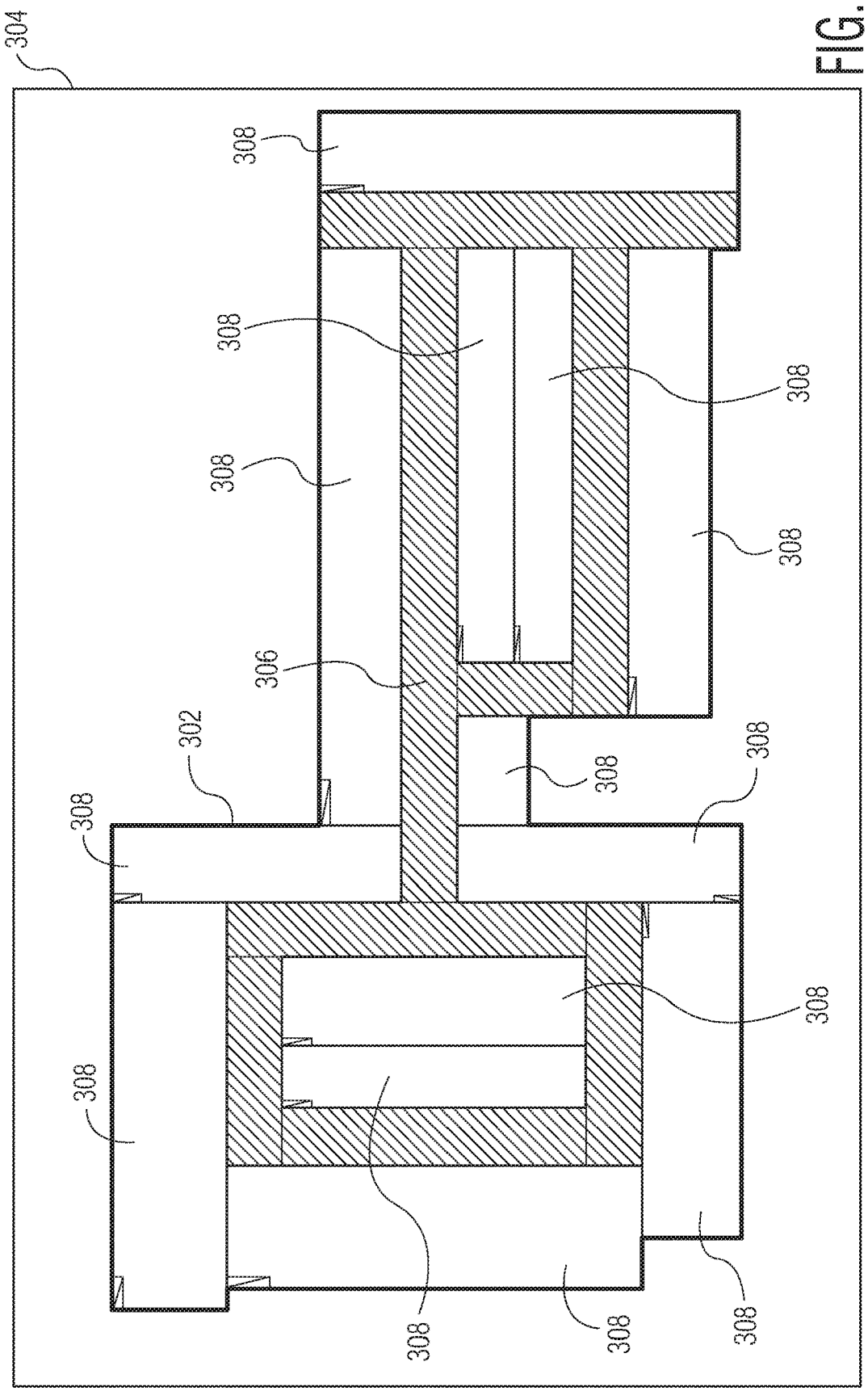
FIG. 3 is an example of a department block.

FIG. 3 is an example of a department block 304. In an embodiment, the department block can be, for example, a surgery department or a patient recovery wing of a hospital and has a defined perimeter 302, a defined circulation pattern 306, length and width dimensions and/or dimension ranges (not shown), and "wells." In an embodiment, a department block may also have a defined architectural "parti." In an embodiment, types of architectural parti include, for example, a courtyard parti, a spine parti, and a spoke parti. In an embodiment, a department block may span multiple floors.

Figure 4:
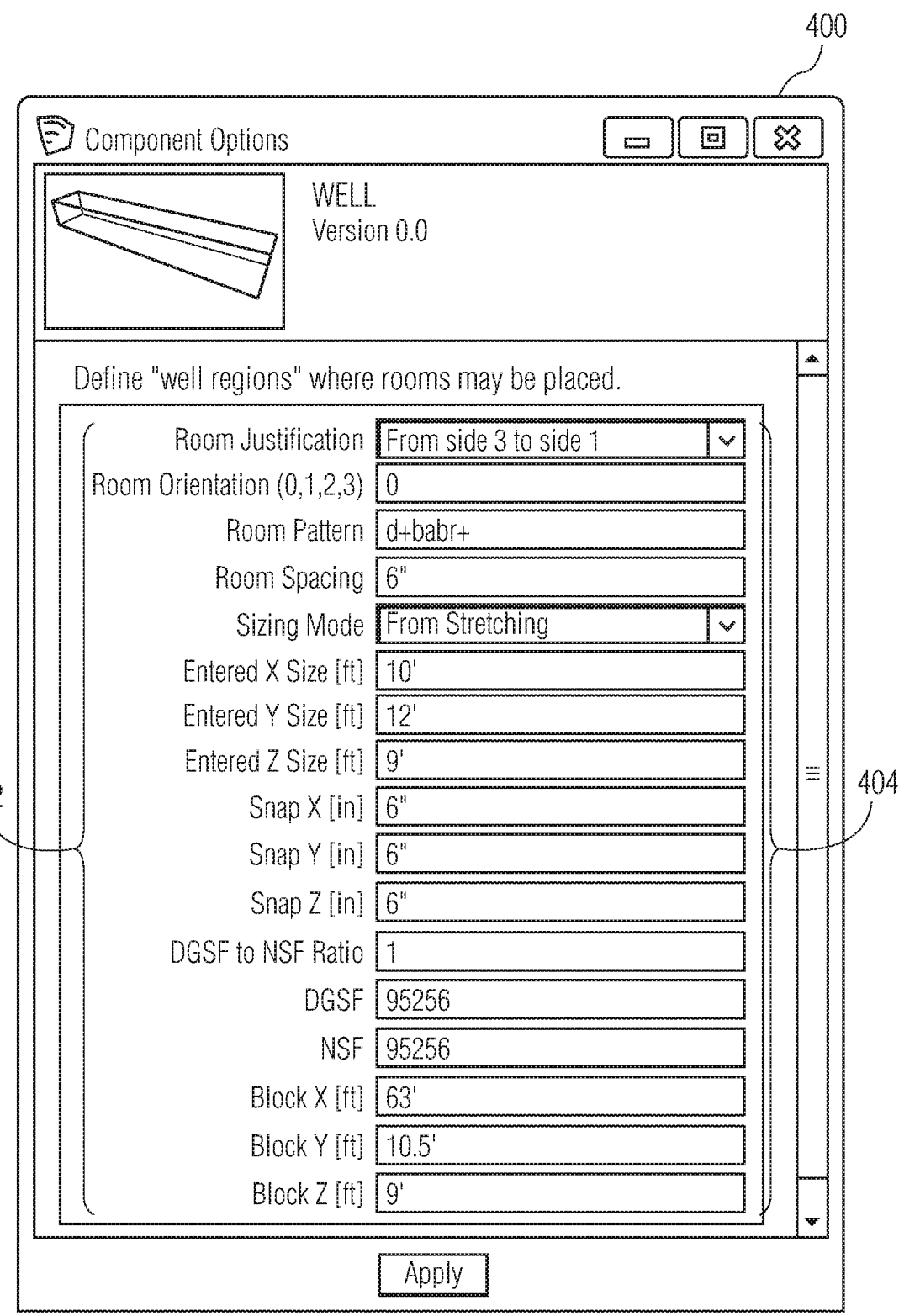
FIG. 4 is an example of a graphical user interface window for defining characteristics of a well.

In an embodiment, a "well" is a three-dimensional region within the department block where rooms can be placed. FIG. 4 is an example of a graphical user interface window 400 for defining characteristics of a well. Each well can be defined with certain properties, including, for example, how rooms are to be oriented in the well, how rooms are to be aligned in the well, and how rooms are to be justified in the well. Additionally, as shown by the example window of FIG. 4, wells can be further defined by parameters 402 corresponding to fillable fields 404 such as room justification, room orientation, room pattern, room spacing, sizing mode, entered X size, entered Y size, entered Z size, snap X, snap Y, snap Z, Departmental Gross Square Feet (DGSF) to Net Square Feet (NSF) ratio, DGSF, NSF, Bock X, Block Y, and Block Z. In an embodiment, the placement of rooms within a well can be defined by a desired pattern of the rooms (referred to as a "room pattern"), which is captured as a "regular expression" using a pattern language as describe below with reference to FIG. 5. In FIG. 4, the well has a corresponding room pattern of "d+babr+".

Room Library

In an embodiment, the room library (e.g., the room library 106 from FIG. 1) is a database of room designs. The database may include information about different types of rooms and each different type of room may have a set of design characteristics. Types of rooms may be defined by the room's intended functionality. For example, in a healthcare environment, the rooms may include a patient recovery room, a patient examination room, a surgery room, a laboratory, a waiting room, a storage room, an administrative office room, and a bathroom. Although a few types of rooms are identified above, other types of rooms can be included in the room library. With respect to a particular room in the room library, e.g., a patient recovery room, certain characteristics are associated with the room. For example, the room in the room library will have a set of physical dimensions (e.g., width, length, and height) and possibly ranges around the dimensions (e.g., 10 ft wide plus or minus 2 feet). The room may also have other characteristics associated with the room such as number of windows, location of windows, number of doors, location of doors, etc. In an embodiment, information from the room library is provided as an .xml file.

Room Placement Tool

In an embodiment, the room placement tool (e.g., the room placement tool 100 from FIG. 1) uses the above-identified information to place rooms in a department block that includes multiple different wells. For example, when placing rooms in a surgery department or in a patient wing of a hospital, the room placement tool receives a space program and a department block (including multiple wells and corresponding room patterns) and, using information in the room library, the room placement tool places the rooms identified in the space program into wells in accordance with room patterns to generate a room placement. For example, the room placement tool may receive an input of a department block that is a patient wing of a hospital and may receive an input of a space program that defines the type and number of rooms to be included in the patient wing of the hospital. The room placement tool then places the types and numbers of rooms defined in the space program into the wells of the department block using information from the room library according to corresponding room patterns defined by the wells of the department block. In an embodiment, placing the rooms into the wells of the department block involves locating a three dimensional model of the room and placing the rooms into the space allocated to the well in a non-overlapping manner. For example, the rooms are placed in the wells based on their corresponding dimensions to fill the wells as near as possible with no overlap between rooms and without extending beyond the borders of the wells. In some embodiments, certain amounts of overlap or extension beyond the borders may be acceptable.

Below is an example of pseudo code for a placement operation that is implemented by the room placement tool:

```
place_rooms {
for each well {
// create all possible patterns from well's regular expression
// taking into account each room's length and area. Throw out
// patterns that exceed each well's capacity.
// A "dictionary" is the set of possible patterns associated
// with one well.
create_dictionary
```

```
    }
    // select a word from each dictionary to create all possible
    // combinations
    create_combination
    for each combination {
        // compare the total rooms against space program.
        // Keep it if it number of rooms match.
        compare_against_space_program
    }
}
```

As described above with regard to department blocks, room patterns can be captured as regular expressions using a pattern language. The regular expressions can be formed using a pattern language that has a vocabulary, syntax, and grammar. FIGS. 5A-5B are a glossary of symbols used by an exemplary pattern language. In the glossary, symbols are identified in the leftmost column, symbolic meaning is identified in the center column, and examples of regular expressions formed using the symbols in the pattern language are provided in the rightmost column. In an embodiment, the pattern language is used to define rules for placing rooms in wells of a department block. Rules for particular types of departments and particular types of wells can be provided as "regular expressions" for the particular type of department and/or particular type of well. The pattern language allows certain design information to be captured in a formal language as "regular expressions" that can be saved and reused for subsequent room placement operations. The pattern language and associated regular expressions allow the knowledge of planners and designers to be captured in a formal language that can be stored and reused in a computer implemented room placement tool. As shown in FIG. 5A-5B, alphabetical characters (e.g., a-z) can be used to represent room types. For example, "a" can represent a patient check-in room and "b" can represent a patient check-out room. Parenthesis can be used to define a grouping. For example, "(abc)" can define a group of room types represented by "a", "b", and "c". Brackets ("[ ]") can be used to define character classes. In an embodiment, a character class is a set of symbols that represent a room type from which a single symbol is matched. For example, "[abc]" can define a character class including "a", "b", and "c" and would define a pattern including "a", "b", or "c". A period can be used as a wild card to define any room. For example, "(a.c)" can be used to define a group of room types including type "a", type "b", and any other type. A question mark can be used to define zero to one occurrences of the previous character, character class, meta-character class, or group in a pattern. For example, "(abc)?" can be used to define a pattern in which "(abc)" never occurs or occurs only once. An asterisk can be used to define zero or more occurrences of the previous character, character class, meta-character class, or group in a pattern. For example, "(ab)*" can be used to define a pattern in which (ab) never occurs as well as any pattern in which (ab) does occur. A "+" can be used to define one or more occurrences of the previous character, character class, meta-character class, or group in a pattern. That is, the previous character, character class, meta-character class, or group can appear multiple times, but must appear at least once. For example, a patterned defined by "a+" would include "a" or "aaaaa", but would not include "bcd". Curly brackets enclosing an integer can be used to define that a previous character, character class, meta-character class, or group occurs in a pattern a number of times equal to the integer. For example, "a{2}" would match on "aa". Curly brackets enclosing two integers separated by a comma can be used to define that a previous character, character class, meta-character class, or group can occur in a pattern a number of times in a range between the two integers. For example, "a{1,3}" can be used to define a pattern in which "a" occurs 1, 2, or 3 times in succession. Curly brackets around an integer and a comma can be used to define that a previous character, character class, meta-character class, or group can occur in a pattern a number of times equal to or greater than the integer in the curly brackets. For example, "a{4,}" can define a pattern in which "a" occurs at least four times in succession (e.g., "aaaa") A "|" can be used to define alternative previous characters, character classes, meta-character classes, or groups in a pattern. For example, "ab|cd" can be used to define a pattern in which either "ab" or "cd" occurs. A backslash and integer can be used to define a backreference in a pattern. For example, "(a(b)c)\1\2" would define a pattern in which the group "abc" is followed by a first group ("abc") and by a second group ("b") to generate pattern "abcabcb". Braces enclosing a carrot can be used to define a negated class in a pattern. For example, "[^abcde]" can be used to define a pattern in which "a", "b", "c", "d", and "e" do not occur.

In an embodiment, the room placement tool can generate multiple different room placements that satisfy the space program and the particular room patterns of the wells. Each generated room placement may differ in the number of rooms included in a department block, but still preserves the captured room pattern. In an embodiment, the multiple different room placements can then be evaluated based on different cost functions and the best one selected. This approach allows a medical planner to describe the room pattern in a very concise language, and generate new designs while keeping the original intent, thus making the medical planner more productive.

Figure 6:
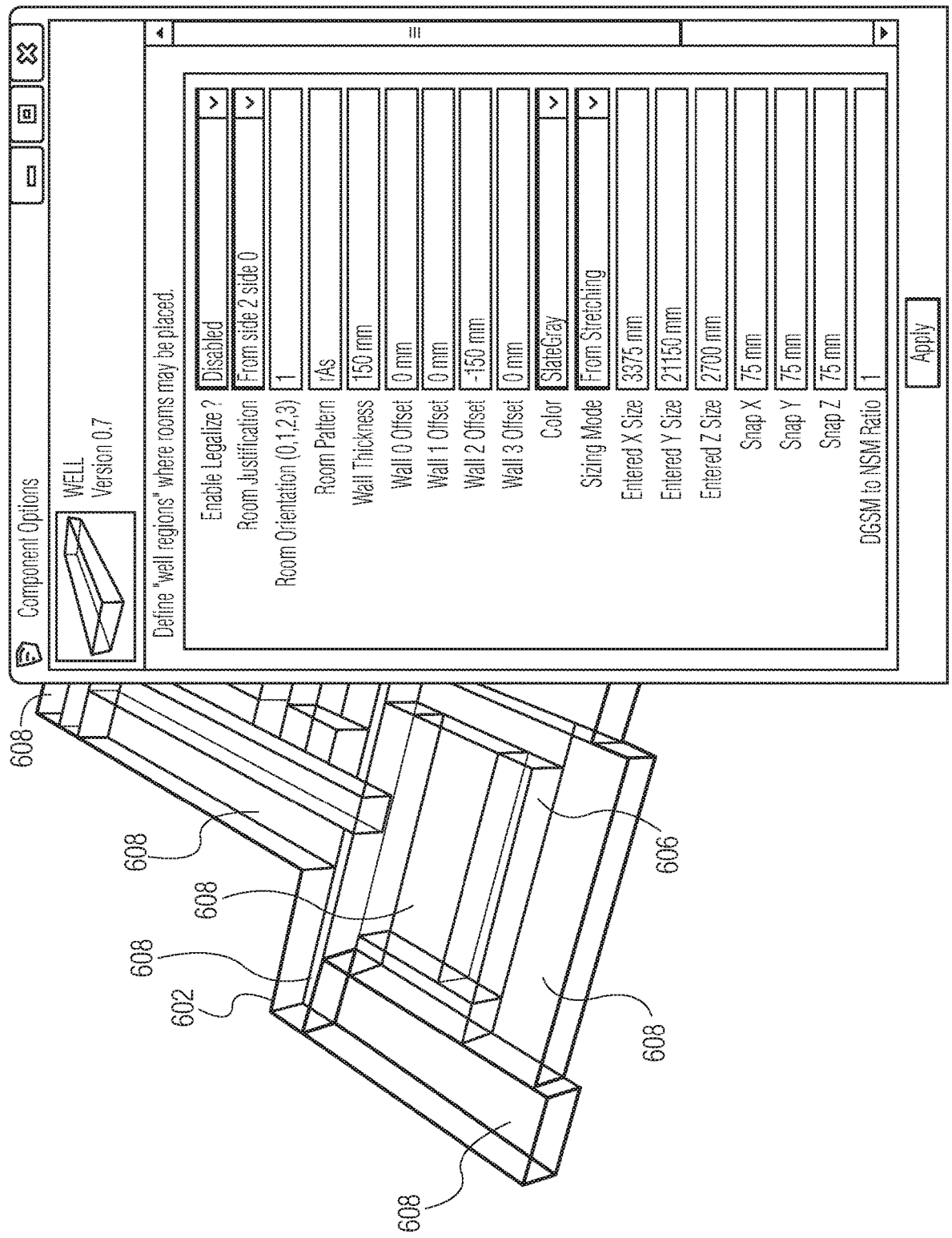
FIG. 6 depicts an example graphical user interface for generating room placements.

FIG. 6 depicts an example graphical user interface for generating room placements. In the example graphical user interface, a department block is displayed in a partial perspective view and the view indicates a perimeter 602, a circulation pattern 606, and wells 608. When a well is selected (e.g., the darkened well), a well data window (e.g., the graphical user interface window described with reference to FIG. 3 above) is overlaid on the partial perspective view. The well data window is populated with information about the highlighted well, including the room pattern. As illustrated in FIG. 6, the well data window includes fillable fields that allow characteristics of the well to be manipulated.

Figure 7:
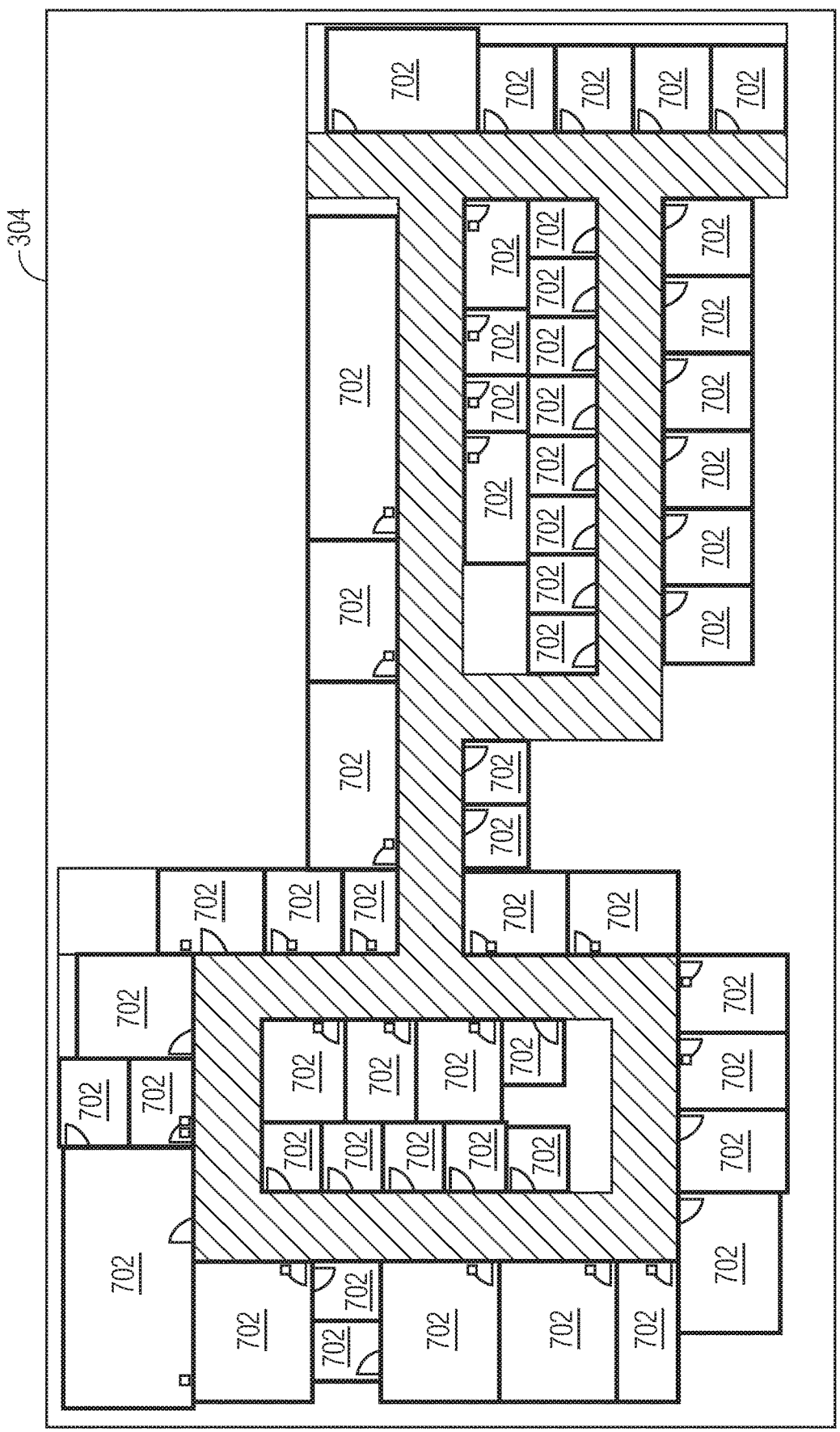
FIG. 7 depicts a plan view of the department block from FIG. 3 after rooms from a space plan have been placed using the above-described techniques

FIG. 7 depicts a plan view of the department block 304 from FIG. 3 after rooms 702 from a space plan (e.g., the space plan 202 described with reference to FIG. 2) have been placed using the above-described techniques. As described above, each well is filled according to the room pattern and the entire department block includes all of the types of rooms in the quantity specified by the space plan.

Figure 8:
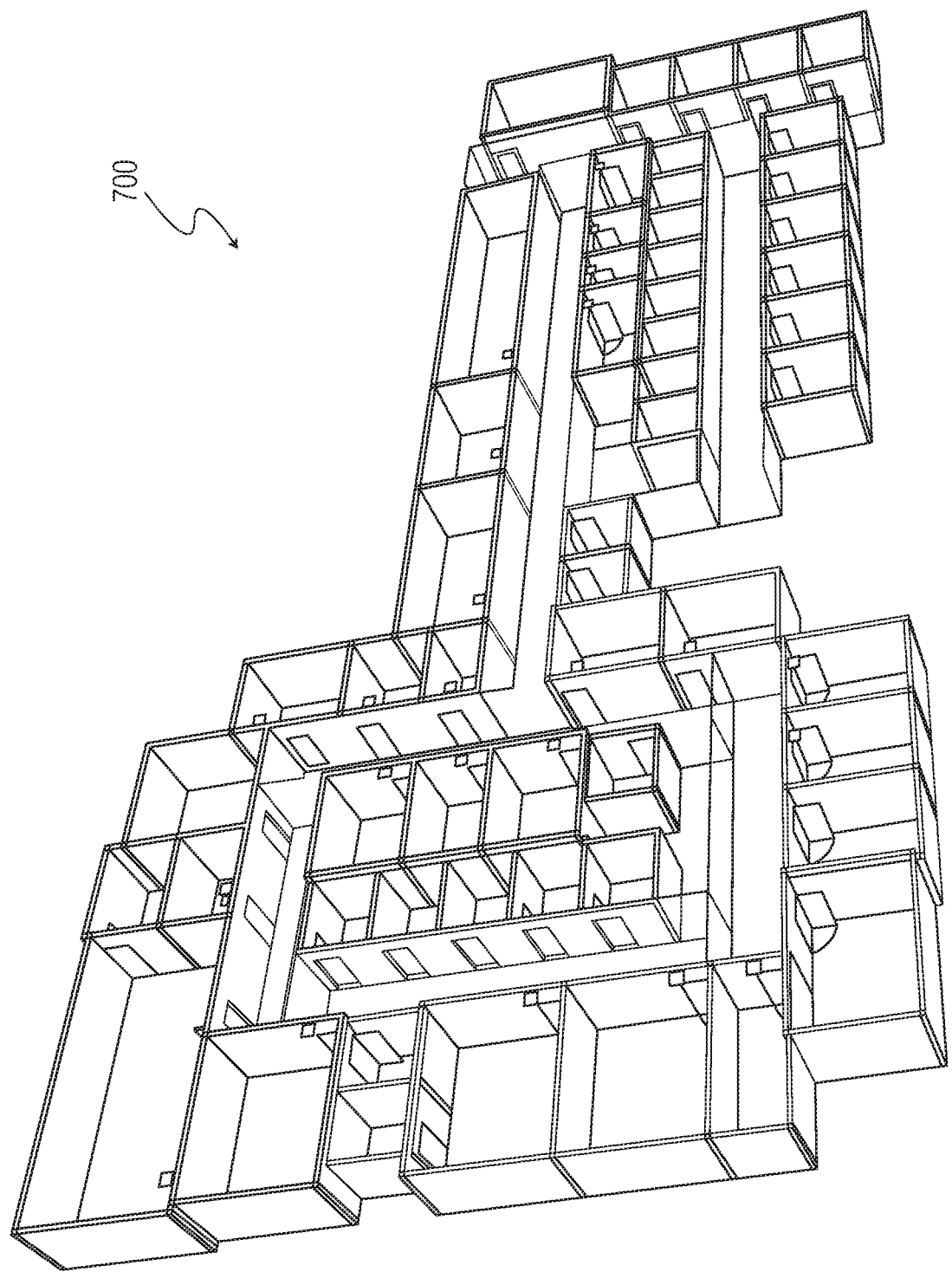
FIG. 8 depicts a perspective view of the placed rooms shown in FIG. 7.

FIG. 8 depicts a perspective view of the placed rooms shown in FIG. 7. In an embodiment, the perspective view is displayed in the graphical user interface of FIG. 6 when the room placement tool has finished placing rooms within the wells of the department block 700.

Figure 9:
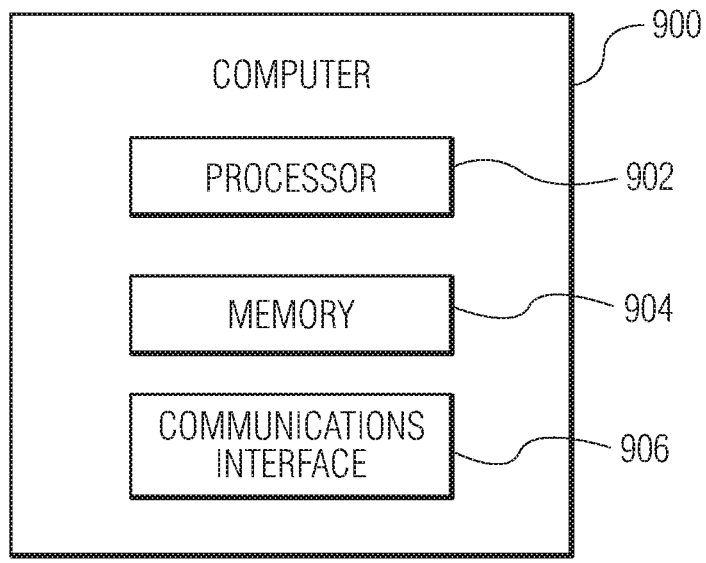
FIG. 9 depicts a computer that includes a processor, memory, and a communications interface.

In an embodiment, the above-described functionality, including functionality performed by the room placement tool, is performed by a computer or computers configured to execute computer readable instructions. FIG. 9 depicts a computer 900 that includes a processor 902, memory 904, and a communications interface 906. The processor may include a multifunction processor and/or an application-specific processor. Examples of processors include the PowerPC™ family of processors by IBM and the x86 family of processors by Intel such as the Xeon™ family of processors and the Intel X5650 processor. The memory within the computer may include, for example, storage medium such as read only memory (ROM), flash memory, RAM, and a large capacity permanent storage device such as a hard disk drive. The communications interface enables communications with other computers via, for example, the Internet Protocol (IP). The computer executes computer readable instructions stored in the storage medium to implement various tasks as described above.

Figure 10:
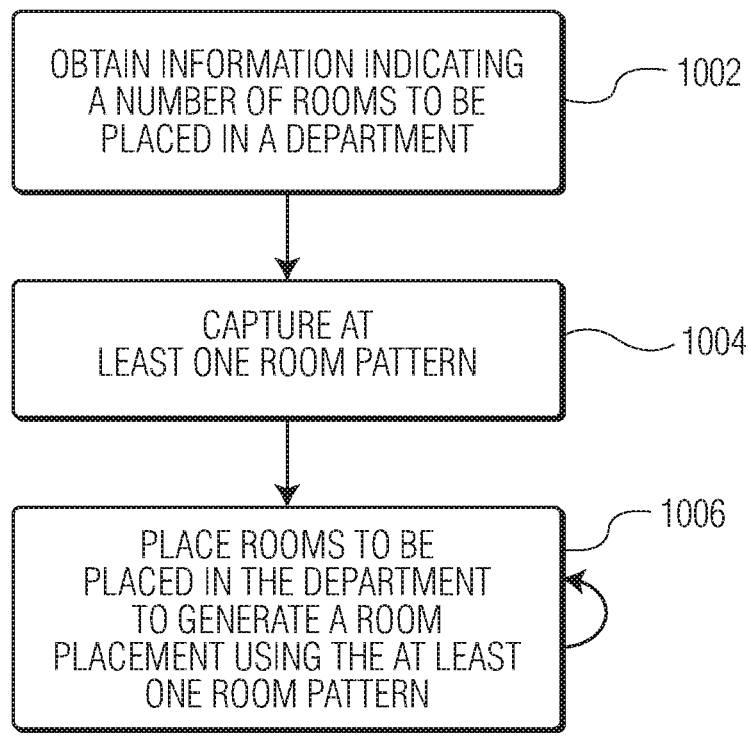
FIG. 10 is a flow chart diagram of a computer-implemented method for generating multiple room placements in accordance with an embodiment of the invention.

FIG. 10 is a flow chart diagram of a computer-implemented method for generating multiple room placements in accordance with an embodiment of the invention. At block 1002, information indicating a number of rooms to be placed in a department is obtained. In an embodiment, the information includes room type information. For example, the information can be obtained from a space plan as described above. At block 1004, at least one room pattern is captured. In an embodiment, the room pattern is captured using a pattern language-based regular expression. At block 1006, rooms are placed in the department using the at least one room pattern to generate a room placement. A plurality of room placements are then generated by repeating the steps at block 1006. In an embodiment, a single room placement can then be selected from the plurality of room placements based on the compared cost of the room placements. For example, the room placement with the lowest cost may be selected.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention, including the room placement tool, can take the form of a computer program product accessible from a computer-usable or computer-readable medium providing computer executable instructions, or program code, for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A computer-implemented method for generating multiple room placements, the method comprising:
   obtaining information indicating a number of rooms to be placed in a department, the information including room type information;
   capturing at least one room pattern using a pattern language-based regular expression; and generating a plurality of room placements using the at least one room pattern by placing the rooms to be placed in the department according to the selected room pattern;
wherein capturing the at least one room pattern using a pattern language-based regular expression involves using a vocabulary of symbols corresponding to rooms and relations between the rooms in the room pattern, a syntax, and a grammar.

2. The computer-implemented method of claim 1, wherein the method further comprises:
evaluating room placements in the plurality of room placements using one or more cost functions;
selecting a room placement from the plurality of room placements based on the evaluations of the room placements; and
outputting a graphical depiction of the at least one room placement.

3. The computer-implemented method of claim 1, wherein room type information includes a room symbol used in the pattern language-based regular expression, room dimensions, a minimum number of rooms which must be of the room type, and a maximum number of rooms which can be of the room type.

4. A computer-implemented method for placing rooms in a department, the method comprising:
obtaining a space plan that identifies the types and numbers of rooms to be placed;
obtaining information about the room types identified in the space plan;
obtaining a department block that includes at least one well, the at least one well having a corresponding room pattern that is defined by a regular expression using a pattern language;
using the space plan, the information about the room types, and the room pattern, generating at least one room placement that defines the placement of all of the rooms from the space plan into the department block according to the room pattern; and
outputting a graphical depiction of the at least one room placement;
wherein the pattern language uses a vocabulary of symbols corresponding to rooms and relations between the rooms in the room pattern, a syntax, and a grammar.

5. The computer-implemented method of claim 4, wherein the method further comprises:
generating a plurality of room placements when generating the at least one room placement;
evaluating room placements in the plurality of room placements using one or more cost functions;
selecting a room placement from the at least one room placement plurality of room placements based on the evaluation of the room placements; and
outputting a graphical depiction of the at least one room placement.

6. The computer-implemented method of claim 4, wherein room type information includes a room symbol used in the pattern language-based regular expression, room dimensions, a minimum number of rooms which must be of the room type, and a maximum number of rooms which can be of the room type.

7. A non-transitory computer readable medium that stores computer readable instructions, which when executed by at least one processor, implement a method for placing rooms in a department, the method comprising:
obtaining a space plan that identifies the types and numbers of rooms to be placed;
obtaining information about the room types identified in the space plan;
obtaining a department block that includes at least one well, the at least one well having a corresponding room pattern that is defined by a regular expression using a pattern language;
using the space plan, the information about the room types, and the room pattern, generating at least one room placement that defines the placement of all of the rooms from the space plan into the department block according to the room pattern; and
outputting a graphical depiction of the at least one room placement;
wherein the pattern language uses a vocabulary of symbols corresponding to rooms and relations between the rooms in the room pattern, a syntax, and a grammar.

8. The non-transitory computer readable medium of claim 7, wherein the method further comprises:
generating a plurality of room placements when generating the at least one room placement;
evaluating room placements in the plurality of room placements using one or more cost functions;
selecting a room placement from the at least one room placement plurality of room placements based on the evaluation of the room placements; and
outputting a graphical depiction of the at least one room placement.

9. The non-transitory computer readable medium of claim 7, wherein room type information includes a room symbol used in the pattern language-based regular expression, room dimensions, a minimum number of rooms which must be of the room type, and a maximum number of rooms which can be of the room type.

10. A computer-implemented method for placing rooms in a department, the method comprising:
obtaining a space plan that identifies the types and numbers of rooms to be placed;
obtaining information about the room types identified in the space plan;
obtaining a department block that includes multiple different wells, each well having a corresponding room pattern that is defined by a regular expression using a pattern language;
using the space plan, the information about the room types, and the room patterns, generating multiple different room placements that define the placement of the rooms from the space plan into the department block according to the corresponding room patterns; and
outputting a graphical depiction of the multiple different room placements;
wherein the pattern language uses a vocabulary of symbols corresponding to rooms and relations between the rooms in the room pattern, a syntax, and a grammar.

11. The computer-implemented method of claim 10, wherein the method further comprises:
evaluating the multiple different room placements using one or more cost functions;
selecting a room placement from the multiple different room placements based on the evaluations of the room placement; and
outputting a graphical depiction of the at least one room placement.

12. The computer-implemented method of claim 10, wherein room type information includes a room symbol used in the pattern language-based regular expression, room dimensions, a minimum number of rooms which must be of the room type, and a maximum number of rooms which can be of the room type.

13. A computer-implemented method for placing rooms in a department, the method comprising:
   obtaining a space plan in an .xml file that identifies the types and numbers of rooms to be placed;
   obtaining information about the room types identified in the space plan from a room library;
   obtaining, in an .xml file, a department block that includes multiple different wells, each well having a corresponding room pattern that is defined by a regular expression using a pattern language;
   using the space plan, the information about the room types, and the room patterns, generating multiple different room placements that define the placement of the rooms from the space plan into the department block according to the corresponding room pattern; and
   outputting a graphical depiction of the multiple different room placements;
   wherein the pattern language uses a vocabulary of symbols corresponding to rooms and relations between the rooms in the room pattern, a syntax, and a grammar.

14. The computer-implemented method of claim 13, wherein the method further comprises:
   evaluating the multiple different room placements using one or more cost functions;
   selecting a room placement from the multiple different room placements based on the evaluation of the room placements; and
   outputting a graphical depiction of the at least one room placement.

15. The computer-implemented method of claim 13, wherein room type information includes a room symbol used in the pattern language-based regular expression, room dimensions, a minimum number of rooms which must be of the room type, and a maximum number of rooms which can be of the room type.

16. A computer-implemented room placement tool, the computer-implemented room placement tool comprising:
   at least one processor; and
   a non-transitory computer readable medium that stores computer readable instructions, which when executed by the at least one processor, implement a method for placing rooms in a department, the method comprising:
   obtaining a space plan that identifies the types and numbers of rooms to be placed;
   obtaining information about the room types identified in the space plan;
   obtaining a department block that includes at least one well, the at least one well having a corresponding room pattern that is defined by a regular expression using a pattern language;
   using the space plan, the information about the room types, and the room pattern, generating at least one room placement that defines the placement of all of the rooms from the space plan into the department block according to the room pattern; and
   outputting a graphical depiction of the at least one room placement;
   wherein the pattern language uses a vocabulary of symbols corresponding to rooms and relations between the rooms in the room pattern, a syntax, and a grammar.

17. The computer-implemented room placement tool of claim 16, wherein the method further comprises:
   generating a plurality of room placements when generating the at least one room placement;
   evaluating room placements in the plurality of room placements using one or more cost functions;
   selecting a room placement from the at least one room placement plurality of room placements based on the evaluation of the room placements; and
   outputting a graphical depiction of the at least one room placement.

18. The computer-implemented room placement tool of claim 16, wherein room type information includes a room symbol used in the pattern language-based regular expression, room dimensions, a minimum number of rooms which must be of the room type, and a maximum number of rooms which can be of the room type.

19. A computer-implemented method for generating multiple room placements, the method comprising:
   obtaining information indicating a number of rooms to be placed in a department, the information including room type information;
   capturing at least one room pattern using a pattern language-based regular expression; and
   generating a plurality of room placements using the at least one room pattern by placing the rooms to be placed in the department according to the selected room pattern;
   wherein room type information includes a room symbol used in the pattern language-based regular expression, room dimensions, a minimum number of rooms which must be of the room type, and a maximum number of rooms which can be of the room type.

20. A computer-implemented method for placing rooms in a department, the method comprising:
   obtaining a space plan that identifies the types and numbers of rooms to be placed;
   obtaining information about the room types identified in the space plan;
   obtaining a department block that includes at least one well, the at least one well having a corresponding room pattern that is defined by a regular expression using a pattern language;
   using the space plan, the information about the room types, and the room pattern, generating at least one room placement that defines the placement of all of the rooms from the space plan into the department block according to the room pattern; and
   outputting a graphical depiction of the at least one room placement;
   wherein room type information includes a room symbol used in the pattern language-based regular expression, room dimensions, a minimum number of rooms which must be of the room type, and a maximum number of rooms which can be of the room type.

21. A non-transitory computer readable medium that stores computer readable instructions, which when executed by at least one processor, implement a method for placing rooms in a department, the method comprising:
   obtaining a space plan that identifies the types and numbers of rooms to be placed;
   obtaining information about the room types identified in the space plan;
   obtaining a department block that includes at least one well, the at least one well having a corresponding room pattern that is defined by a regular expression using a pattern language;
   using the space plan, the information about the room types, and the room pattern, generating at least one room placement that defines the placement of all of the rooms from the space plan into the department block according to the room pattern; and outputting a graphical depiction of the at least one room placement;

wherein room type information includes a room symbol used in the pattern language-based regular expression, room dimensions, a minimum number of rooms which must be of the room type, and a maximum number of rooms which can be of the room type.

22. A computer-implemented method for placing rooms in a department, the method comprising:

obtaining a space plan that identifies the types and numbers of rooms to be placed;

obtaining information about the room types identified in the space plan;

obtaining a department block that includes multiple different wells, each well having a corresponding room pattern that is defined by a regular expression using a pattern language;

using the space plan, the information about the room types, and the room patterns, generating multiple different room placements that define the placement of the rooms from the space plan into the department block according to the corresponding room patterns; and outputting a graphical depiction of the multiple different room placements;

wherein room type information includes a room symbol used in the pattern language-based regular expression, room dimensions, a minimum number of rooms which must be of the room type, and a maximum number of rooms which can be of the room type.

23. A computer-implemented method for placing rooms in a department, the method comprising:

obtaining a space plan in an .xml file that identifies the types and numbers of rooms to be placed;

obtaining information about the room types identified in the space plan from a room library;

obtaining, in an .xml file, a department block that includes multiple different wells, each well having a corresponding room pattern that is defined by a regular expression using a pattern language;

using the space plan, the information about the room types, and the room patterns, generating multiple different room placements that define the placement of the rooms from the space plan into the department block according to the corresponding room pattern; and outputting a graphical depiction of the multiple different room placements;

wherein room type information includes a room symbol used in the pattern language-based regular expression, room dimensions, a minimum number of rooms which must be of the room type, and a maximum number of rooms which can be of the room type.

24. A computer-implemented room placement tool, the computer-implemented room placement tool comprising:

at least one processor; and a non-transitory computer readable medium that stores computer readable instructions, which when executed by the at least one processor, implement a method for placing rooms in a department, the method comprising:

obtaining a space plan that identifies the types and numbers of rooms to be placed;

obtaining information about the room types identified in the space plan;

obtaining a department block that includes at least one well, the at least one well having a corresponding room pattern that is defined by a regular expression using a pattern language;

using the space plan, the information about the room types, and the room pattern, generating at least one room placement that defines the placement of all of the rooms from the space plan into the department block according to the room pattern; and outputting a graphical depiction of the at least one room placement;

wherein room type information includes a room symbol used in the pattern language-based regular expression, room dimensions, a minimum number of rooms which must be of the room type, and a maximum number of rooms which can be of the room type.

* * * * *